United States Patent [19]

Mikoshiba

[11] 4,227,203
[45] Oct. 7, 1980

[54] SEMICONDUCTOR DEVICE HAVING A POLYCRYSTALLINE SILICON DIODE

[75] Inventor: Hiroaki Mikoshiba, Tokyo, Japan

[73] Assignee: Nippon Electric Co., Ltd., Tokyo, Japan

[21] Appl. No.: 882,766

[22] Filed: Mar. 2, 1978

[30] Foreign Application Priority Data

Mar. 4, 1977 [JP] Japan .................... 52-23594

[51] Int. Cl.³ .................. H01L 29/04; H01L 27/04
[52] U.S. Cl. ........................ 357/59; 357/20; 357/92
[58] Field of Search .......... 357/20, 59, 48, 46, 357/44, 92, 4

[56] References Cited

U.S. PATENT DOCUMENTS

| | | | |
|---|---|---|---|
| 3,443,175 | 5/1909 | Czorny et al. | 357/59 |
| 3,570,114 | 3/1971 | Bean et al. | 357/59 |
| 3,648,128 | 3/1972 | Kobayashi | 357/59 |
| 3,651,385 | 3/1972 | Kobayashi | 357/59 |
| 3,904,450 | 9/1975 | Evans et al. | 357/59 |

OTHER PUBLICATIONS

Davies et al., IEEE J. of Solid State Circuits, vol. SC 12, No. 4, Aug. 1977, pp. 367–375.
Hewlett, "Schottky I²L," IEEE J. of Solid-State Circuits, vol. SC 10, No. 5, Oct. 1075, pp. 343–344.

*Primary Examiner*—William D. Larkins
*Attorney, Agent, or Firm*—Hopgood, Calimafde, Kalil, Blaustein & Lieberman

[57] ABSTRACT

A semiconductor device includes a substrate of one conductivity type and a polycrystalline silicon layer of the opposite conductivity type formed on a major surface of the substrate. A p-n junction establishing an effective diode is formed on the polycrystalline silicon layer as a result of the introduction of the impurities of the one conductivity type from the substrate into the polycrystalline silicon layer.

6 Claims, 10 Drawing Figures

SEMICONDUCTOR DEVICE HAVING A POLYCRYSTALLINE SILICON DIODE

BACKGROUND OF THE INVENTION

Field of the Invention:

The present invention relates generally to semiconductor, and more particularly to a semiconductor device including a polycrystalline silicon diode.

Polycrystalline silicon has been widely used in semiconductor circuits and devices as passive elements such as gate electrodes, wirings, and resistors. Moreover, the art of forming a diode, that is, a P-N junction, in polycrystalline silicon has been practiced in fields such as the field of solar batteries. In such a diode formed in polycrystalline silicon, a recombination-generation current is predominant, and it is, therefore, expected that the forward voltage in this diode will be smaller than that in a diode formed in monocrystalline silicon. In addition, since the lifetime of minority carriers in a polycrystal is very short due to the large number of recombination centers caused by grain boundaries, fast operation of a polycrystalline diode appears to be attainable.

However, in the formation of a P-N junction in polycrystalline silicon in the prior art, a major surface of a monocrystalline semiconductor substrate is covered with an insulator film on which polycrystalline silicon layer of one conductivity type is formed, and an impurity region of the opposite conductivity type is formed in the polycrystalline silicon layer from its surface to a certain depth. In such a structure, it is difficult to stably form a P-N junction in a polycrystalline silicon layer due to the fact that fluctuations of the thickness of the polycrystalline silicon layer, as well as the diffusion constant of an impurity in polycrystalline silicon, are large. It has also been proposed to form the region of the opposite conductivity type so deep that it may reach the insulator film. However, according to this method, the junction area of the P-N junction is reduced because the junction is formed only along a side surface of the region of the opposite conductivity type, resulting in an increase of current density, so that the forward voltage becomes high. These prior art techniques are disclosed, for example, in Solid-State Electronics, 1972 Vol. 15, p.p. 1103-1106.

The power-speed product is recognized as one of the indexes representing the performance of a logic circuit. This index is proportional to the product of three parameters, circuit voltage, logic amplitude voltage, and circuit capacity. For optimum logic circuit performance it is desirable that this product be made as low as possible. One approach for improving the power speed product has been to reduce the a logic amplitude by making use of a Schottky barrier diode. As one example, a Schottky I²L (Integrated Injection Logic) has been developed. However, it is difficult to combine an I²L and a Schottky diode, because the collector of a transistor in the I²L would have a high impurity concentration due to the structural requirement for an integrated circuit, and it is difficult to form a Schottky barrier on the collector region. To this end, an attempt has been made to form the base by the injection of high energy ions, thereby to lower the surface impurity concentration of the collector region. However, it is difficult in this approach to achieve a cut off frequency $f_T$ of an NPN transistor of a sufficiently high value, such that the advantage obtained by employing a Schottky barrier diode would be lost. Such an I²L is disclosed, for example, at IEEE J. of Solid State Circuits, Vol. SC-10, No. 5, Oct. 1975, p.p. 343-348.

SUMMARY OF THE INVENTION

Therefore, one object of the present invention is to provide a semiconductor device in which a polycrystalline silicon diode having a low forward voltage is stably formed.

Another object of the present invention is to provide a semiconductor device with a diode on a highly doped region, such as an I²L circuit device having a diode in place of a Schottky diode.

According to one feature of the present invention, there is provided a semiconductor device comprising a monocrystalline semiconductor region of one conductivity type, a polycrystalline semiconductor layer of an opposite conductivity type formed on the semiconductor region and having a lower impurity concentration than the impurity concentration of the semiconductor region, and a P-N junction formed in the polycrystalline semiconductor layer by the introduction of impurities of the one conductivity type from the monocrystalline semiconductor region into the polycrystalline semiconductor layer.

According to another feature of the present invention, there is provided a semiconductor device comprising a monocrystalline silicon substrate, a polycrystalline silicon layer including a first polycrystalline film of one conductivity type formed on a major surface of the silicon substrate and a second polycrystalline film of the opposite conductivity type formed on a surface of the first polycrystalline film so as to form a P-N junction between the first and second polycrystalline films. The polycrystalline film has major impurities of the one conductivity type introduced from the major surface of the substrate.

According to yet another feature of the present invention, the film thickness of the first polycrystalline film is less than that of the second polycrystalline film.

An insulator layer with a window may be formed on the major surface of the substrate and a P-N junction may be formed in a portion of the polycrystalline film extending into the window of the insulator layer.

The semiconductor device according to the present invention may be formed by depositing on a highly doped single crystal region, such as a high-concentration collector region of one conductivity type, a polycrystalline silicon layer of the opposite conductivity type and having a lower impurity concentration, for example, by a chemical vapor deposition technique at a temperature of 800° C. or lower, and introducing the one conductivity type impurity of the highly doped region into the lower concentration polycrystalline silicon layer by heat treatment, such that a P-N junction is formed in the polycrystalline silicon layer. In this way, a P-N junction diode can be easily formed. Since the forward voltage of this P-N junction diode is lower than that of common P-N junction diodes, as will be described later, the logic amplitude of a device employing a P-N junction diode of this type, e.g. of an I²L device, can be reduced, and it is therefore possible to improve the power-speed product of the circuit.

The surface impurity concentration of the single crystal semiconductor region of the one conductivity type is preferably $10^{21}$ cm$^{-3}$ or lower, and more preferably not less than $10^{19}$ cm$^{-3}$, and the impurity concentration of the polycrystalline layer is preferably not more than that but still should be as high as possible. If the surface impurity concentration of the single crystal region is higher than $10^{21}$ cm$^{-3}$, in a common polycrystalline silicon layer having a film thickness of 1 μm or lower, the impurity such as phosphorus is diffused up to the vicinity of the surface of the polycrystalline silicon layer and the P-N junction is formed in the neighborhood of the surface. Therefore, such a higher concentration is undesirable.

Other features and advantages of the present invention will become apparent upon a perusal of the following specification taken in connection with the accompanying drawings.

Figure 1:
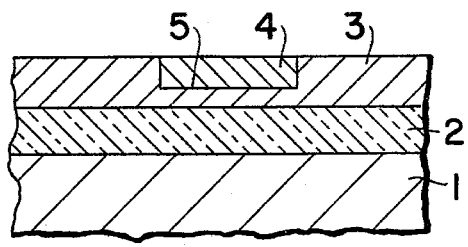
FIGS. 1 and 2 are cross-sectional views respectively showing prior art polycrystalline silicon diodes.

The prior art P-N junction in polycrystalline silicon illustrated in FIG. 1 includes an insulator film 2 formed on a silicon substrate 1 and a polycrystalline silicon layer 3 of one conductivity type deposited thereon. Into this polycrystalline silicon layer 3 is selectively diffused an impurity to form a region 4 of the opposite conductivity type from the surface of layer 3. The boundary of region 4 forms a P-N junction 5, with the silicon layer 3.

Figure 2:
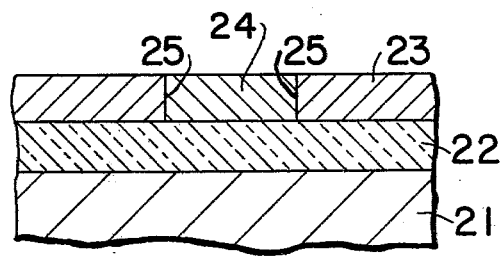

Another prior art P-N junction in polycrystalline silicon is shown in FIG. 2, in which an insulator film 22 is formed on a silicon substrate 21 and a polycrystalline silicon layer 23 of one conductivity type is deposited thereon. Into this polycrystalline silicon layer 23 is selectively diffused an impurity until it reaches the insulator film 22 to form a region 24 of the opposite conductivity type. The side surfaces 25 of region 24 form P-N junction surfaces with the layer 23.

Figure 3:
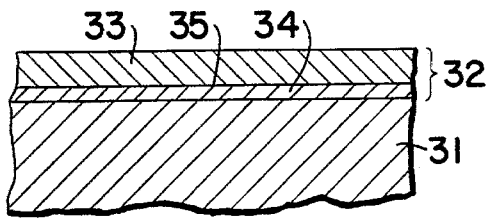
FIG. 3 is a cross-sectional view of a polycrystalline silicon diode according to a first embodiment of the invention.

FIG. 3 illustrates a first preferred embodiment of a polycrystalline silicon diode according to the present invention. As therein shown, a polycrystalline silicon layer 32 having a thickness of 0.7 μm is formed on an N$^+$-type monocrystalline silicon region 31 containing phosphorus at a surface concentration of $10^{20}$ cm$^{-3}$ by the thermal decomposition of silane at temperatures from 600° C. to 800° C. The polycrystalline silicon layer 32 is either doped with boron serving as an impurity at a concentraton of $5 \times 10^{19}$ cm$^{-3}$ upon vapor growth, or doped with boron at the same concentration by thermal diffusion or ion injection after growth. In this way, the concentration of boron in the polycrystalline silicon layer 32 is made lower than the surface concentration of phosphorus in the monocrystalline silicon region 31. As a result of this process, during a heat treatment at a temperature of about 900° C. for a period of thirty minutes, for example, the phosphorus in the monocrystalline silicon region 31 diffuses into the polycrystalline silicon layer 32, and thereby a P-N junction 35 is formed between the P type film 33 and the N type film 34 in the polycrystalline silicon layer 32 at a depth of about 0.5 μm from the surface of the polycrystalline silicon layer. An advantage of this method is that the P-N junction 35, which constitutes a diode, can be reliably formed in the polycrystalline silicon layer and in parallel with the surface of the substrate 31 so long as the concentration of boron is lower than the concentration of phosphorus. In addition, the diode is stable against fluctuations in the thickness of the polycrystalline silicon layer. Furthermore, since the junction area can be made sufficiently broad, the forward voltage of the polycrystalline silicon diode can be easily lowered in comparison to the conventional silicon diodes.

Figure 6:
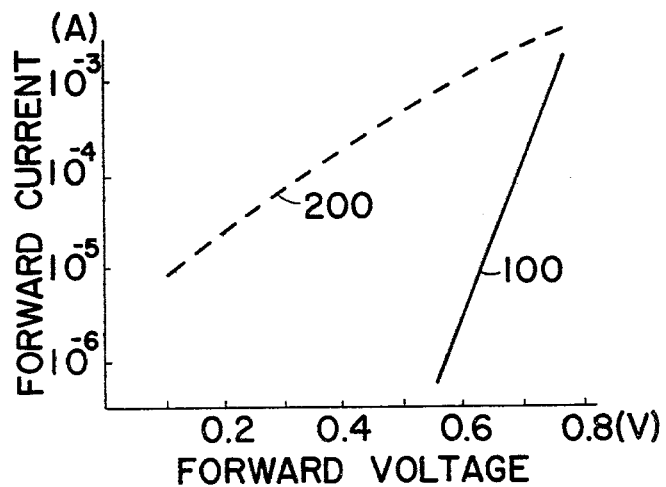
FIG. 6 is a diagram comparing the forward characteristics of a polycrystalline silicon diode according to the present invention and a conventional silicon diode.

FIG. 6 shows the forward voltage characteristic 200 of a polycrystalline silicon diode obtained according to the present invention as compared to the forward voltage characteristic 100 of a conventional silicon diode. As seen in this figure, the forward voltage of a polycrystalline silicon diode according to the invention is reduced significantly as the forward current is decreased. For instance, for a forward current of $10^{-4}$ A in the respective diodes, the forward voltage is about 0.7 V for a conventional silicon diode, whereas in a polycrystalline silicon diode according to the present invention the forward voltage is less than 0.4 V.

Figure 4A:
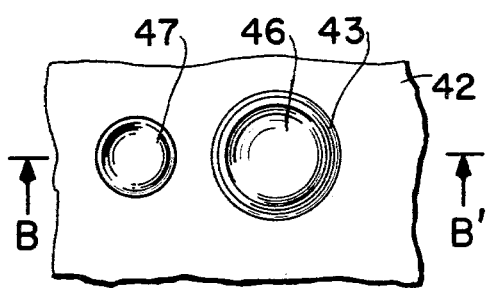
FIGS. 4(A) and 4(B) are respectively a plan view and a cross-sectional view taken along section line B—B' in the direction of the arrows of a polycrystalline silicon diode according to a second embodiment of the invention.
Figure 4B:
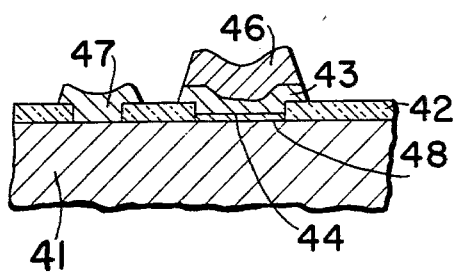

In the second embodiment of the invention illustrated in FIGS. 4(A) and 4(B). A polycrystalline silicon layer 43 is formed selectively on a major surface 48 of a P$^+$-type monocrystalline silicon substrate 41 containing boron at a surface concentration of $5 \times 10^{\circ}$cm$^{-3}$. The polycrystalline silicon layer 43 is doped with phosphorus at a concentration of $10^{20}$ cm$^{-3}$. A P-N junction 44 is formed in the polycrystalline silicon layer 43 and is surrounded with a silicon dioxide layer 42 having a film thickness of 0.5 μm formed on the major surface of the substrate 41 by a heat treatment at a temperature of about 950° C. for a period of thirty minutes. Then, a cathode electrode 46 is formed on the upper surface of the polycrystalline layer 43, and an anode electrode 47 is connected to the major surface of the substrate 41.

Figure 5:
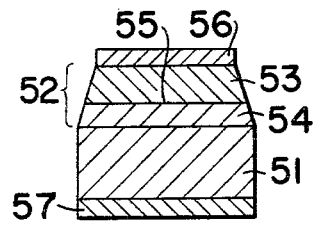
FIG. 5 is a cross-sectional view of a polycrystalline silicon diode according to a third embodiment of the invention.

A third embodiment of this invention as illustrated in FIG. 5, includes a polycrystalline silicon layer 52 having a thickness of 1.0 μm formed on an entire surface of an N$^+$-type monocrystalline silicon substrate 51 containing arsenic at a surface concentration of $10^{20}$ cm$^{-3}$. The polycrystalline silicon layer 52 is doped with boron at a concentration of $5 \times 10^{19}$ cm$^{-3}$. Then, the arsenic in the monocrystalline silicon substrate 51 is diffused into the polycrystalline silicon layer 52 to form an N-type region 54 in the monocrystalline silicon layer 52 by a heat temperature at a temperature of about 900° C. for a period of thirty minutes, thereby to form a P-N junction 54 between the P-type region 53 and the N-type region 54 in the polycrystalline silicon layer 52. The P-N junction 55 is formed in parallel with the surface of the substrate 51, and is exposed at the side surface of the polycrystalline silicon layer 52. A cathode electrode 57 is then electrically connected to the substrate 51 at an opposite surface thereof, and an anode electrode 56 is electrically connected to an upper surface of the P-type region 56 of the polycrystalline silicon layer 52.

Figure 7:
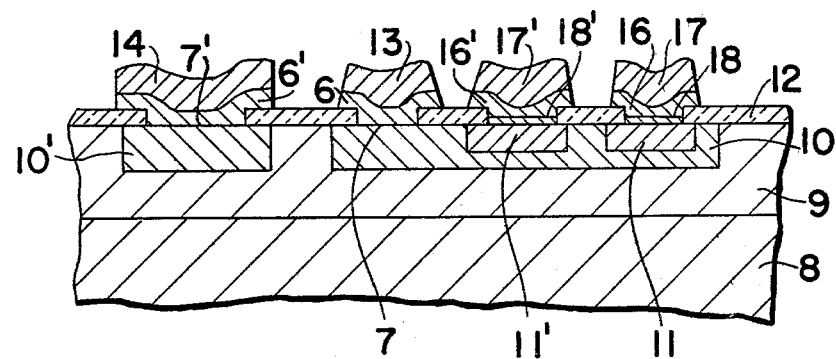
FIG. 7 is a cross-sectional view of an I²L circuit device including polycrystalline silicon diodes of this invention.

An example of the application of the polycrystalline silicon diode of this invention is described as applied to an I²L circuit device, with reference to FIG. 7. Although this figure illustrates the most general structure of an I²L circuit by way of example, it is, of course, possible to apply the polycrystalline silicon diode according to the present invention to I²L circuits having different structure.

With reference to FIG. 7, an N-type epitaxial layer 9 is formed on an N⁺-type silicon substrate 8. By selectively diffusing an impurity into epitaxial layer 9, P-type regions 10 and 10' are formed. By further diffusing an impurity selectively into the P-type region 10, N⁺-type regions 11 and 11' are formed. An insulator film 12 then formed on the surface of this device, and apertures are formed in insulator film 12 for making contact with the respective regions 10, 10', 11 and 11'. A polycrystalline layer is then deposited over the entire surface of the device, and the polycrystalline silicon layer is selectively etched so as to leave the portions 16, 16', 6 and 6' on the above-mentioned contact regions. If boron was previously introduced into the silicon layer to make it P-type, then the impurity in the N⁺-type collector regions 11 and 11' is diffused into the P-type silicon layer having a lower concentration by a heat treatment during or after the growth of the polycrystalline silicon, and thereby P-N junctions 18, 18' are formed. These P-N junctions are used as polycrystalline silicon diodes. An aluminum layer is then deposited on the polycrystalline silicon layer 16, 16', 6 and 6' for forming electrodes, and an I²L circuit device is thus achieved.

An one method for selective etching of the polycrystalline silicon layer, after the formation of the aluminum layer for wiring on the polycrystalline silicon layer, selective etching of the aluminum layer could be effected, and then the etching of the polycrystalline silicon layer could be effected by making use of the selectively etched aluminum layer as a mask.

As a result, the electrodes 13, 14 are electrically connected to the P-type regions 10, 10' through the polycrystalline silicon layers 6, 6', and the electrodes 17, 17' are electrically connected to the N⁺-type collector regions 11, 11' through the polycrystalline silicon diodes consisting of the P-N junctions 18 and 18'.

Figure 8:
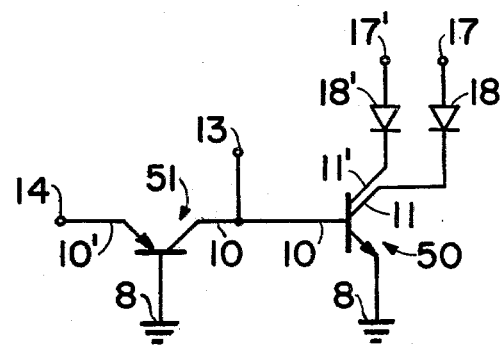
FIG. 8 is an equivalent circuit diagram of the I²L circuit device shown in FIG. 7.

FIG. 8 shows an equivalent circuit diagram of the I²L circuit device illustrated in FIG. 7, in which a component part equivalent to that shown in FIG. 7 is given a like reference numeral. More particularly, an inverter transistor 50 has a multi-collector construction, an emitter corresponding to the silicon substrate 8, a base corresponding to the P-type region 10, and collectors corresponding to the N⁺-type regions 11 and 11', respectively. The collector regions 11 and 11' are connected via the polycrystalline silicon layer 16, 16', through the P-N junction diodes 18 and 18' to external connection electrodes 17 and 17', respectively. The base region 10 of the transistor 50 is connected to a base contact 13, which serves as an input to the I²L circuit. An injection transistor 51 has a lateral structure in which the N⁺ epitaxial layer 9 and the N region 8 serve as a base, the P region 10 serves as a collector, the N region 10' serves as an emitter, and the emitter region 10' is connected to an emitter contact 14 to be applied with a voltage from a voltage source (not shown).

Assuming for example, that in the circuit shown in FIG. 8, for example, the anode output of the polycrystalline silicon diode 18 is connected to an input terminal 13 of an I²L inverter circuit (having the same circuit construction as the circuit shown in FIG. 8) in the next stage (not shown), the characteristic operations of the circuit in FIG. 8 can be described. When a high level signal is applied to input terminal 13, the inverter transistor 50 becomes conductive, and assumes a saturated state. Accordingly, at an output terminal 17 (an input terminal 13 in the next stage) is generated a voltage equal to $V_{OL} = V_{CE(S)} + V_P$, where $V_{CE(S)}$ represents a collector emitted saturated voltage and $V_P$ represents a forward voltage of the polycrystalline silicon diode 18. In order for voltage $V_{OL}$ to be a voltage level adapted to bring the inverter transistor in the next stage of the circuit into a cut-off state, that is, to be the so-called lower level, it is only necessary to fulfill the relation of $V_{OL} < V_{BE}$ (where $V_{BE}$ is the base-emitter forward voltage of the transistor 50). Accordingly, the forward voltage $V_P$ of the polycrystalline silicon diode 18 should necessarily take a value of $V_P < V_{BE} - V_{CE(S)}$. Since $V_{BE}$ is about 0.7 V and $V_{CE(S)}$ is about 0.1 V, it is only necessary that $V_P$ be 0.6 V or smaller, and the forward currents ranging from $10^{-5}$ to $10^{-3}$ ampere are apparently fulfilled as shown in FIG. 6, which illustrates the forward characteristics of the polycrystalline silicon diode according to the present invention.

Figure 9:
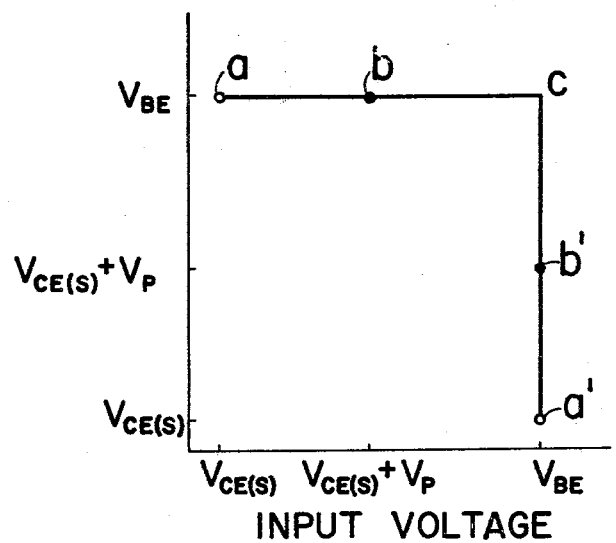
FIG. 9 is a diagram explaining the input-output transfer characteristics of the I²L circuit device shown in FIG. 7.

Assuming that a source voltage applied to the emitter 14 of the injection transistor 51 in FIG. 8 is represented by $V_{BE}$, then the higher level of the I²L circuit becomes equal to $V_{BE}$, so that the input-output transfer characteristics of the circuit shown in FIG. 8 are represented by the b-c, b'-c lines depicted in FIG. 9, while those of the conventional I²L circuit are represented by the a-c, a'-c lines. As will be apparent from FIG. 9 as well as an above description, in the I²L circuit having polycrystalline silicon diodes according to the present invention, since the higher level is equal to $V_{BE}$ and the lower level is equal to $(V_{CE(S)} + V_P)$, the signal swing becomes equal to $V_{BE} - (V_{CE(S)} + V_P)$ whereas in the conventional I²L circuit it is equal to $V_{BE} - V_{CE(S)}$. Therefore, according to the present invention, the signal swing is reduced by $V_P$, so that the above-mentioned power-speed product becomes smaller and the performance of the circuit is enhanced.

It is to be noted that since the logic amplitude is reduced by $V_P$ as described above, the noise margin is also lowered. However, in general in a bipolar transistor logic circuit such as an I²L circuit, since it is only necessary to have a logic amplitude of 100 mV or greater, we obtain the relation of:

$$V_{BE} - (V_{CE(S)} + V_P) \geq 100 \text{ mV},$$

and in the above relation, since $V_{BE} = 700$ mV and $V_{CE(S)} = 100$ mV, it is only necessary to fulfill the relation of $V_P \leq 500$ mV. Such values of $V_P$ can be well realized as will be apperent from FIG. 6. Moreover, the I²L structure shown in FIG. 7 uses polycrystalline silicon diodes having P-N junction 18, 18' formed in the polycrystalline layer 16, 16' by introducing the impurity from the collector regions 11, 11', and therefore, the collector regions 11, 11' having a high impurity concentration and the base region 10 having a narrow base width (between the collector region and the N⁺ epitaxial layer 9) can be easily designed and fabricated so as to raise the cut off frequency $f_T$ of the NPN transistor 50 to a high level.

As described above, the polycrystalline silicon diode according to the present invention can be fabricated by a simple manufacturing process, and a device employing the diode of the invention has remarkably improved characteristics such as an improved power-speed product.

I claim:

1. A semiconductor device comprising a monocrystalline silicon substrate and a polycrystalline silicon layer including a first polycrystalline film of one conductivity type formed on a major surface of said monocrystalline silicon substrate, and a second polycrystalline film of an opposite conductivity type formed on a surface of said first polycrystalline film so as to form a P-N junction between said first and second polycrystalline films, said P-N junction being substantially flat and parallel with said major surface of said monocrystalline silicon substrate and ending at a peripheral side surface of said polycrystalline silicon layer.

2. A semiconductor device comprising a monocrystalline silicon substrate, and a polycrystalline silicon layer including a first polycrystalline film of one conductivity type formed on a major surface of said monocrystalline silicon substrate and a second polycrystalline film of an opposite conductivity type formed on a surface of said first polycrystalline film so as to form a P-N junction between said first and second polycrystalline films, said first polycrystalline film containing a major impurity of said one conductivity type introduced thereinto from said major surface of said monocrystalline silicon substrate, said P-N junction being substantially parallel with said major surface of said monocrystalline silicon surface.

3. The semiconductor device of claim 2, further comprising an insulator film having a window therein filled with said polycrystalline silicon layer, said P-N junction being formed in said window and adjacent to the side wall surface of said window at its end line.

4. The semiconductor device of claim 3, in which said polycrystalline silicon layer extends on the surface of said insulator film.

5. The semiconductor device of claim 2, in which the thickness of said first polycrystalline film is less than that of said second polycrystalline film.

6. An integrated injection logic device comprising a semiconductor substrate of N conductivity type, an insulating film having an aperture formed on a major surface of said semiconductor substrate, first and second regions of P conductivity type selectively formed in said major surface of said semiconductor substrate, a third region of N conductivity type formed in said major surface within said second region, a polycrystalline layer formed on said major surface on said third region and within said aperture, a P-N junction being formed in said polycrystalline silicon layer in parallel with said major surface and adjacent to the side wall surface of said aperture at its end, a first electrode electrically connected to said semiconductor substrate, a second electrode electrically connected to said first region, a third electrode electrically connected to said second region, and a fourth electrode formed on a surface of said polycrystalline layer.

* * * * *